United States Patent
Rhyner et al.

(10) Patent No.: US 11,380,520 B2
(45) Date of Patent: Jul. 5, 2022

(54) RF POWER DELIVERY TO VACUUM PLASMA PROCESSING

(71) Applicant: EVATEC AG, Trubbach (CH)

(72) Inventors: Stefan Rhyner, Buchs (CH); Martin Bless, Malans (CH)

(73) Assignee: EVATEC AG, Trübbach (CH)

( * ) Notice: Subject to any disclaimer, the term of this patent is extended or adjusted under 35 U.S.C. 154(b) by 67 days.

(21) Appl. No.: 16/763,575

(22) PCT Filed: Oct. 26, 2018

(86) PCT No.: PCT/EP2018/079424
§ 371 (c)(1),
(2) Date: May 13, 2020

(87) PCT Pub. No.: WO2019/096564
PCT Pub. Date: May 23, 2019

(65) Prior Publication Data
US 2021/0358718 A1   Nov. 18, 2021

(30) Foreign Application Priority Data

Nov. 17, 2017   (CH) .................................... 01393/17

(51) Int. Cl.
*H01J 37/32* (2006.01)
*H01J 37/18* (2006.01)

(52) U.S. Cl.
CPC ........ *H01J 37/32183* (2013.01); *H01J 37/18* (2013.01); *H01J 37/32577* (2013.01); *H01J 2237/002* (2013.01)

(58) Field of Classification Search
None
See application file for complete search history.

(56) References Cited

U.S. PATENT DOCUMENTS 3,955,110 A  *  5/1976  Karlen .................... H02K 3/22
                                                        310/59
4,679,007 A       7/1987  Reese et al.
                  (Continued)

FOREIGN PATENT DOCUMENTS

EP      0597497 A1    5/1994
EP      0413110 B1    6/1995
        (Continued)

OTHER PUBLICATIONS

International Search Report for PCT/EP2018/079424 dated Jan. 25, 2019.
Written Opinion for PCT/EP2018/079424 dated Jan. 25, 2019.

*Primary Examiner* — Srinivas Sathiraju
(74) *Attorney, Agent, or Firm* — Pearne & Gordon LLP

(57) ABSTRACT

Rf power is supplied to a vacuum processing module in that in the plasma processing module a time invariant impedance transform is performed by an impedance transform network in the plasma processing module and a time variable matching is performed by a matchbox connected to the impedance transform network. The impedance transform network includes an inductive element of a hollow conductor. A cooling medium is flown through the hollow conductor of the impedance transform network as well as through a part of the plasma processing module to be cooled and not being part of the impedance transform network at the plasma processing module.

25 Claims, 10 Drawing Sheets

(56) References Cited

U.S. PATENT DOCUMENTS

Figure 1:
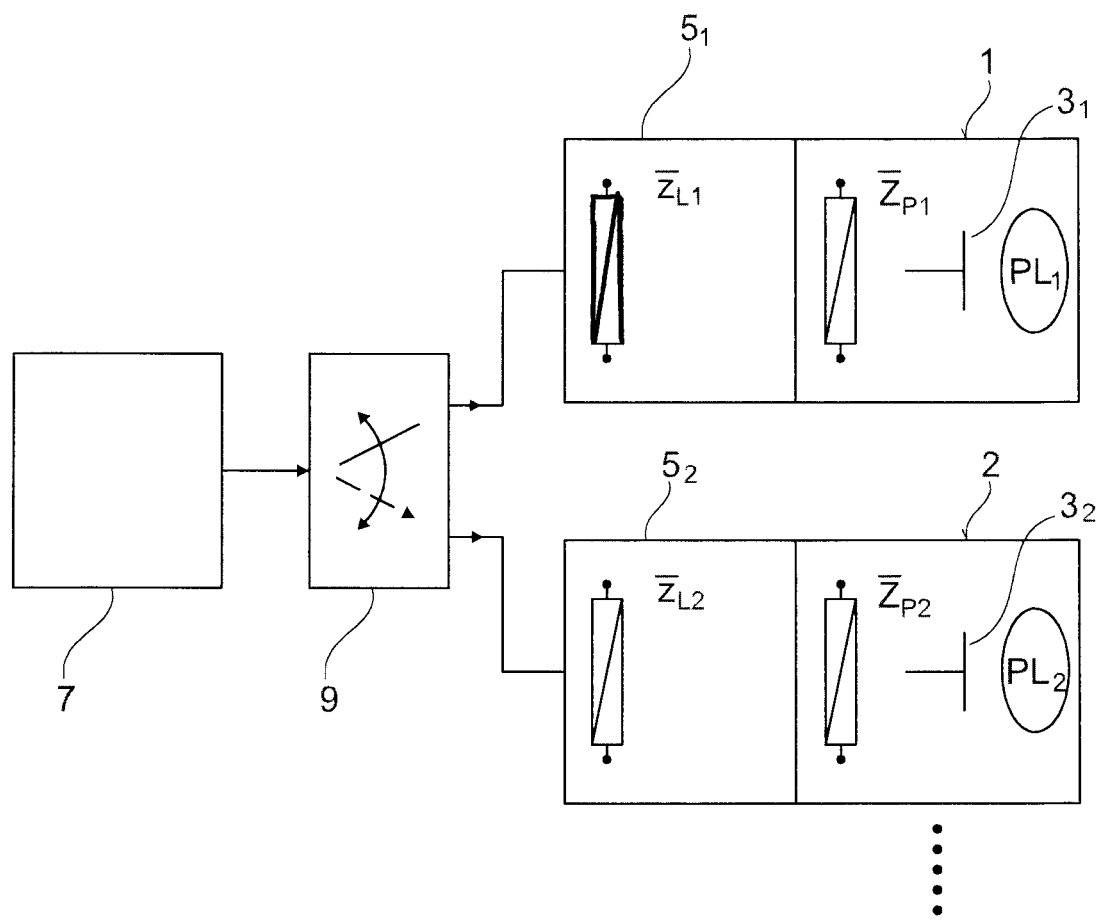

| | | | | |
|---|---|---|---|---|
| 4,849,675 A * | 7/1989 | Muller | ............... | H01J 27/16 315/111.81 |
| 5,572,170 A * | 11/1996 | Collins | ............ | H01J 37/32165 257/E21.252 |
| 6,288,378 B1 * | 9/2001 | Patridge | ............... | H05B 6/36 219/661 |
| 6,313,587 B1 * | 11/2001 | MacLennan | ......... | H01J 61/025 315/307 |
| 6,376,978 B1 * | 4/2002 | Leung | ................. | H05H 1/46 428/467 |
| 6,949,887 B2 * | 9/2005 | Kirkpatrick | ........... | H05B 41/24 315/246 |
| 7,042,311 B1 * | 5/2006 | Hilliker | ............ | H01J 37/32183 333/133 |
| 7,301,343 B1 * | 11/2007 | Sellers | ............. | G01R 33/28 324/318 |
| 8,187,416 B2 * | 5/2012 | Miller | ............. | H01J 37/32495 156/345.48 |
| 9,460,894 B2 * | 10/2016 | Lill | ................ | H01J 37/32422 |
| 9,624,572 B2 * | 4/2017 | Rieschl | ............. | H01J 37/3426 |
| 9,694,990 B2 * | 7/2017 | Voser | ................. | B25J 15/0608 |
| 9,918,376 B2 | 3/2018 | Thomas | ............. | H01J 37/321 |
| 10,056,230 B2 * | 8/2018 | Hirano | ............. | H01J 37/32091 |
| 10,128,085 B2 * | 11/2018 | Wada | .............. | H01L 21/3081 |
| 10,141,163 B2 * | 11/2018 | Lill | ................. | H01J 37/32128 |
| 10,157,729 B2 * | 12/2018 | Valcore, Jr. | ........ | H01J 37/32082 |
| 10,347,515 B2 * | 7/2019 | Heinz | .............. | H01L 21/67751 |
| 10,424,461 B2 * | 9/2019 | Lill | ................. | H01J 37/32146 |
| 2004/0027209 A1 * | 2/2004 | Chen | ................ | H01J 37/32082 333/32 |
| 2004/0050327 A1 * | 3/2004 | Johnson | ............ | H01J 37/32082 118/640 |
| 2004/0194709 A1 * | 10/2004 | Yamagishi | ............ | C23C 16/401 118/723 E |
| 2006/0017386 A1 * | 1/2006 | Sorensen | .......... | H01J 37/32082 315/111.21 |
| 2006/0027327 A1 * | 2/2006 | Sorensen | .......... | H01J 37/32082 156/345.47 |
| 2011/0233170 A1 * | 9/2011 | Yamazawa | ........ | H01J 37/32174 204/192.1 |
| 2012/0018410 A1 * | 1/2012 | Zakrzewski | ......... | H05H 1/46 219/121.48 |
| 2013/0119863 A1 * | 5/2013 | Hanawa | ............ | H01J 37/32183 315/111.21 |
| 2014/0138361 A1 * | 5/2014 | Zakrzewski | ............. | H05H 1/46 315/111.21 |
| 2015/0002018 A1 * | 1/2015 | Lill | ................... | H01J 37/32082 315/111.21 |
| 2015/0075719 A1 * | 3/2015 | Ramaswamy | ...... | H01J 37/3266 156/345.44 |
| 2016/0379804 A1 * | 12/2016 | Lill | ................... | H01J 37/32706 315/111.21 |
| 2019/0027344 A1 * | 1/2019 | Okunishi | .......... | H01J 37/32541 |
| 2019/0103253 A1 * | 4/2019 | Lill | ................... | H01J 37/32422 |
| 2021/0358718 A1 * | 11/2021 | Rhyner | ............. | H01J 37/32577 |

FOREIGN PATENT DOCUMENTS

| | | | | |
|---|---|---|---|---|
| WO | WO-0167830 A1 * | 9/2001 | ............ | H01J 37/321 |
| WO | 02059933 A2 | 8/2002 | | |
| WO | WO-02059933 A2 * | 8/2002 | ........ | H01J 37/32082 |
| WO | 2012099774 A1 | 7/2012 | | |

* cited by examiner

RF POWER DELIVERY TO VACUUM PLASMA PROCESSING

Rf (radio frequency) power is customarily supplied to vacuum plasma processing modules—be it as power for supplying the plasma discharge and/or power for biasing an electrode e.g. a workpiece carrier electrode, separate from discharge electrodes—in that a matchbox is provided which matches the output impedance of a RF power supply generator to the input impedance of the vacuum processing module. Such a vacuum plasma processing module is e.g. a sputtering module, an etching module, an electron-beam deposition module, a PECVD module (Plasma Enhanced Chemical Deposition) or even a cathodic arc evaporation module. As addressed Rf power may be supplied for supplying the plasma discharge or for, more generically, just for biasing an electrode participating to the processing, as e.g. a substrate carrier electrode. As the plasma impedance varies in time, the matchbox has costumery the ability of fast and automatic adapting matching to the momentarily prevailing input impedance of the vacuum plasma processing module.

Moreover, the input impedances of vacuum plasma processing modules are different and behave different even if such modules considered are of the same type, e.g. sputtering modules, but are differently operated, e.g. with different material target, in different gaseous atmospheres etc.

Throughout the present description we refer to vacuum plasma processing modules to be different, if their input impedances are different and/or behave differently over time.

Moreover, we refer to a frequency being a radio frequency (RF) if it is at least 1 MHz.

A matchbox assigned to a respective vacuum plasma processing module is customarily mounted directly to the supplied vacuum plasma processing module, handles the high RF currents to be supplied to the respective vacuum plasma processing module and performs fast, automatic impedance matching. Different vacuum plasma processing modules are operated via the respective number of such match boxes specifically tailored for the respective vacuum plasma processing module.

This customary technique is exemplified and described later, in context with a FIG. 1.

It is an object of the present invention to provide an alternative Rf power delivery approach.

This is realized by a method of RF power delivering from a RF supply generator to at least one vacuum plasma processing module comprising time varying matching the output impedance of the RF supply generator to the input impedance of the vacuum plasma processing module by a) Providing in the vacuum plasma processing module an impedance transform network and performing by this impedance transform network a time invariant impedance transform of the input impedance of the vacuum plasma processing module to an input impedance to the impedance transform network;

b) Performing time variable matching of the output impedance of the RF supply generator to the input impedance of the impedance transform network by a matchbox operationally connected to the impedance transform network.

By splitting the overall matching on one hand in a time-invariant part at the vacuum plasma processing module and, on the other hand, in a time variable part, realized by the addressed matchbox, it becomes possible to provide the matchbox remote from the vacuum plasma processing module and to provide a simpler, less expensive matchbox.

One variant of the method according to the invention comprises performing by the impedance transform network a current compensation so as to deliver to a vacuum plasma process operated in the vacuum plasma processing module a current which is larger than a supply current supplied to the input of the impedance transform network from the RF supply generator.

This allows to provide the matchbox remote from the vacuum plasma processing module and thereby to tailor an interconnection, including the matchbox, between the output of the RF power supply generator and the vacuum plasma processing module to stand lower RF currents than needed for performing the vacuum plasma process in the vacuum plasma processing module.

One variant of the method according to the invention comprises interconnecting the output of the RF supply generator and the impedance transform network comprising interconnecting by a transmission line and, in a further embodiment, the addressed interconnecting comprises interconnecting by a coaxial cable.

In one variant of the method according to the invention constructing the impedance transform network comprises providing inductive and capacitive elements which are all discrete and passive elements.

In one variant of the method according to the invention at least some parts of the impedance transform network are cooled.

One variant of the method according to the invention comprises providing at least a part of at least one inductive element of said impedance transform network by a hollow conductor and flowing a cooling medium through said hollow conductor.

In one variant of the just addressed variant of the method according to the invention, said cooling, medium is additionally flown through a cooling arrangement of a part of the vacuum plasma processing module which is not a part of the impedance transform network.

One variant of the method according to the invention comprises RF power delivering from said RF supply generator to at least two of said vacuum plasma processing modules via a single, central matchbox.

One variant of the method according to the invention comprises RF power delivering from the RF supply generator, consecutively, to at least two of the vacuum plasma processing modules and performing, consecutively, at least time variable matching of the output impedance of the RF supply generator to the input impedances of the at least two impedance transform networks by a single, central matchbox.

Thereby only one matchbox is to be provided, which performs automatically the fast matching adaptation to the respective time varying part of the input impedances of the at least two impedance transform networks as provided in the at least two vacuum plasma processing modules.

One variant of the just addressed variant of the method according to the invention comprises performing by at least one of the at least two impedance transform networks a current compensation, so as to deliver to a vacuum plasma process performed in the respective vacuum plasma processing module a current which is larger than a supply current supplied to the at least one respective impedance transform network from the RF supply generator.

Thereby one variant of the method according to the invention comprises performing a respective one of the addressed current compensation at both of said at least two impedance transform networks.

In one variant of the method according to invention interconnecting the output of the RF supply generator and at least one of the at least two impedance transform networks comprises interconnecting by a transmission line, thereby, and in a further variant, interconnecting by the transmission line comprises interconnecting by a coaxial cable.

In one variant of the method according to the invention interconnecting the output of the RF supply generator and each of the at least two impedance transform networks comprises interconnecting by a respective transmission line, whereby each of said transmission lines may comprise a coaxial cable.

In one variant of the method according to the invention constructing the at least two impedance transform networks comprises providing inductive and capacitive elements which are all discrete and passive elements.

One variant of the method according to the invention comprises performing by each of the respective at least two impedance transform networks a respective time invariant impedance transform of the respective input impedance of the respective vacuum plasma processing module to a respective desired input impedance to the respective impedance transform network, time invariant components of the absolute values of resulting, desired input impedances being in a desired or predetermined range or being mutually neglectably different or being equal.

In one variant of the method according to the invention comprises the at least two vacuum plasma processing modules are different in the sense as we have defined above.

One variant of the method according to the invention comprises RF supplying by the impedance transform network of said at least one vacuum plasma processing module at least one of a plasma discharge current to the at least one vacuum plasma processing module and of providing RF biasing or workpiece RF biasing to the at least one vacuum plasma processing module.

In one variant of the method according to the invention the at least one vacuum plasma processing module is one of a sputtering module, an etching module, a PECVD layer deposition module, a cathodic arc evaporation module, a plasma evaporation module, an electron beam evaporation module.

One variant of the method according to the invention comprises performing by the impedance transform network a current compensation by means of a shunt impedance One variant of the method according to the invention comprises connecting an electrode for plasma processing to more than one output of the impedance transform network.

Thereby and in one variant, distribution of RF currents at said more than one outputs is selected or selectable.

The method according to the invention may also be considered under the aspect of being a method for manufacturing vacuum plasma treated workpieces.

The method according to the invention may be realized by means of an apparatus or plant as addressed in the following.

Two or more variants of the method according to the invention may be combined unless being in contradiction.

The object as addressed above is also achieved by a RF vacuum plasma processing module comprising a time invariant impedance transform network between an RF supply input and at least one of a plasma discharge electrode and of a RF biased electrode for the vacuum plasma processing.

In one embodiment of the RF vacuum plasma processing module according to the invention, the time invariant impedance transform network comprises inductive and capacitive elements, all being discrete and passive elements.

In one embodiment of the RF vacuum plasma processing module according to the invention the time invariant impedance transform network is constructed to supply a RF current to the addressed electrode which is larger than a RF supply current input to the time invariant impedance transform network. The time invariant impedance transform network thus performs current compensation.

In one embodiment of the RF vacuum plasma processing module according to the invention the time invariant impedance transform network comprises a cooling arrangement.

In one embodiment of the RF vacuum plasma processing module according to the invention the time invariant impedance transform network comprises at least one inductive element at least a part thereof being realized as a hollow conductor.

In one embodiment of the RF vacuum plasma processing module according to the invention the hollow conductor is flow-connectable, or flow connected to at least one of a flow-source and of a flow-drain for a cooling fluid. We understand as a flow-source a device where the flow originates and as a flow-drain a device where the flow goes to.

In one embodiment of the RF vacuum plasma processing module according to the invention the cooling arrangement at the time invariant impedance transform network comprises a hollow body, e.g. at least a part of an inductive element realized as a hollow conductor, flow connected to a source and/or a drain for a cooling fluid, the hollow body being in cooling fluid communication with a part of the vacuum plasma processing module which is not part of said time invariant impedance transform network.

In one embodiment of the RF vacuum plasma processing module according to the invention the time invariant impedance transform network is manually tunable.

In one embodiment of the RF vacuum plasma processing module according to the invention the time invariant impedance transform network has more than one RF current output.

In one embodiment of the RF vacuum plasma processing module according to the invention the more than one RF current outputs are connected to the electrode, i.e. to the same electrode.

One embodiment of the RF vacuum plasma processing module according to the invention is one of a sputter module, an etching module, a PECVD module, a cathodic arc evaporation module, a plasma evaporation module, an electron-beam evaporation module.

Two or more than two embodiments of the RF vacuum plasma processing module according to the invention may be combined, if not contradictory.

The object as addressed above is further resolved by a plasma treatment plant, comprising at least two of the RF vacuum plasma processing modules according to the invention or according to one or more than one of its embodiments, and at least one RF supply generator operatively connected to a match box, the RF output of the matchbox being operatively connected to the RF inputs of both time invariant impedance transform networks of the at least two vacuum plasma processing modules.

In one embodiment of the plasma treatment plant according to the invention the match box is constructed to perform automatic, time variant matching to the input impedances of both of said time invariant impedance transform networks.

One embodiment of the plasma treatment plant according to the invention comprises a switch unit and a timing control unit operationally connected to a control input of said switch unit, said switch unit being constructed to switch RF power supply consecutively to said at least two time invariant impedance transform networks.

In one embodiment of the plasma treatment plant according to the invention the at least two vacuum plasma processing modules are different modules, different being defined as addressed above.

In one embodiment of the plasma treatment plant according to the invention the Rf power supply connection from the RF power generator to the at least two time invariant impedance transform networks comprises at least one transmission line. Thereby, in a further embodiment, the addressed transmission line comprises at least one coaxial cable.

In one embodiment of the plasma treatment plant according to the invention each of the time invariable impedance transform networks of the at least two vacuum plasma processing modules is constructed to provide its input impedance so as to comprise a time invariant impedance part, the absolute value of the time invariant impedance parts of the at least two time invariant impedance networks being in a desired range or being only neglectably different or being equal.

In one embodiment of the plasma treatment plant according to the invention the match box is remote from the at least two vacuum plasma processing modules.

Two or more than two embodiments of the plasma treatment plant according to the invention may be combined unless contradictory.

The invention is further directed to a method of manufacturing a substrate treated by a RF supplied vacuum plasma treatment by means of a method according to the invention or according to one or more than one variant thereof and/or by a module according to the invention or one or more than one embodiment thereof and/or by a plant according to the invention or one or more than one embodiments thereof.

The invention shall further be described by examples and with the help of figures.

Figure 2:
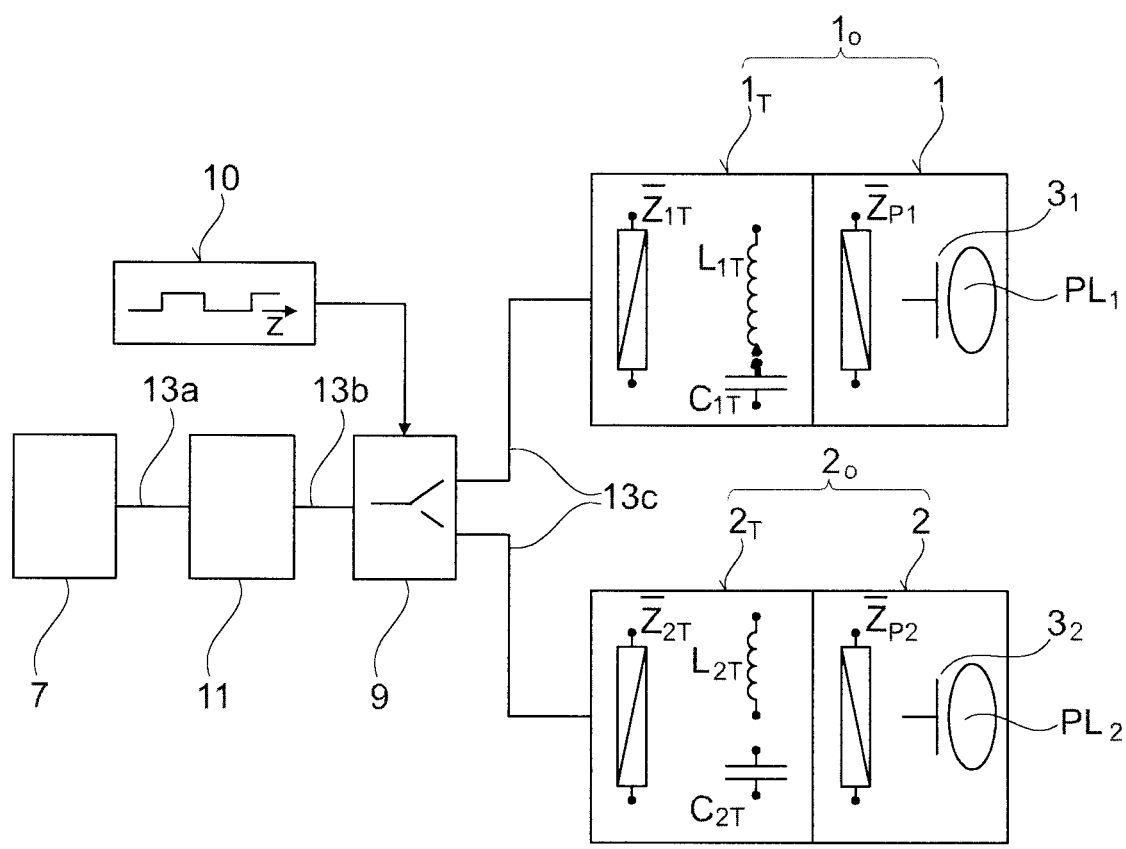
Figure 3:
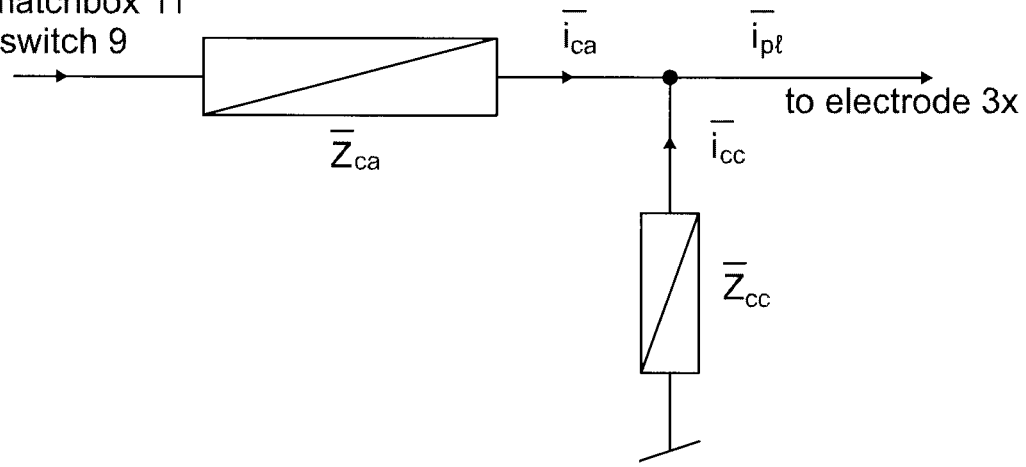
Figure 4:
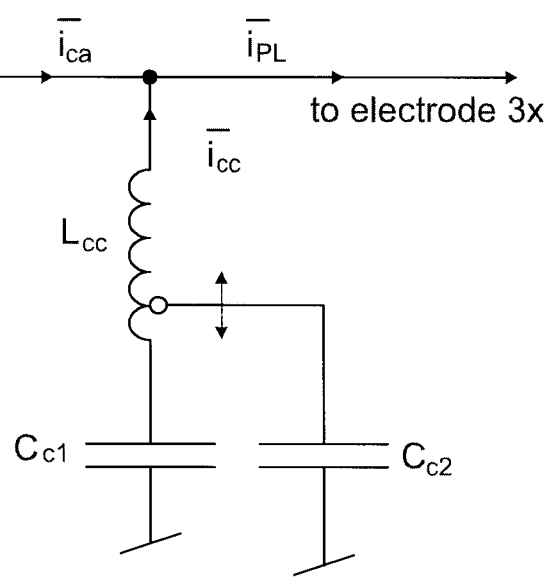
Figure 5:
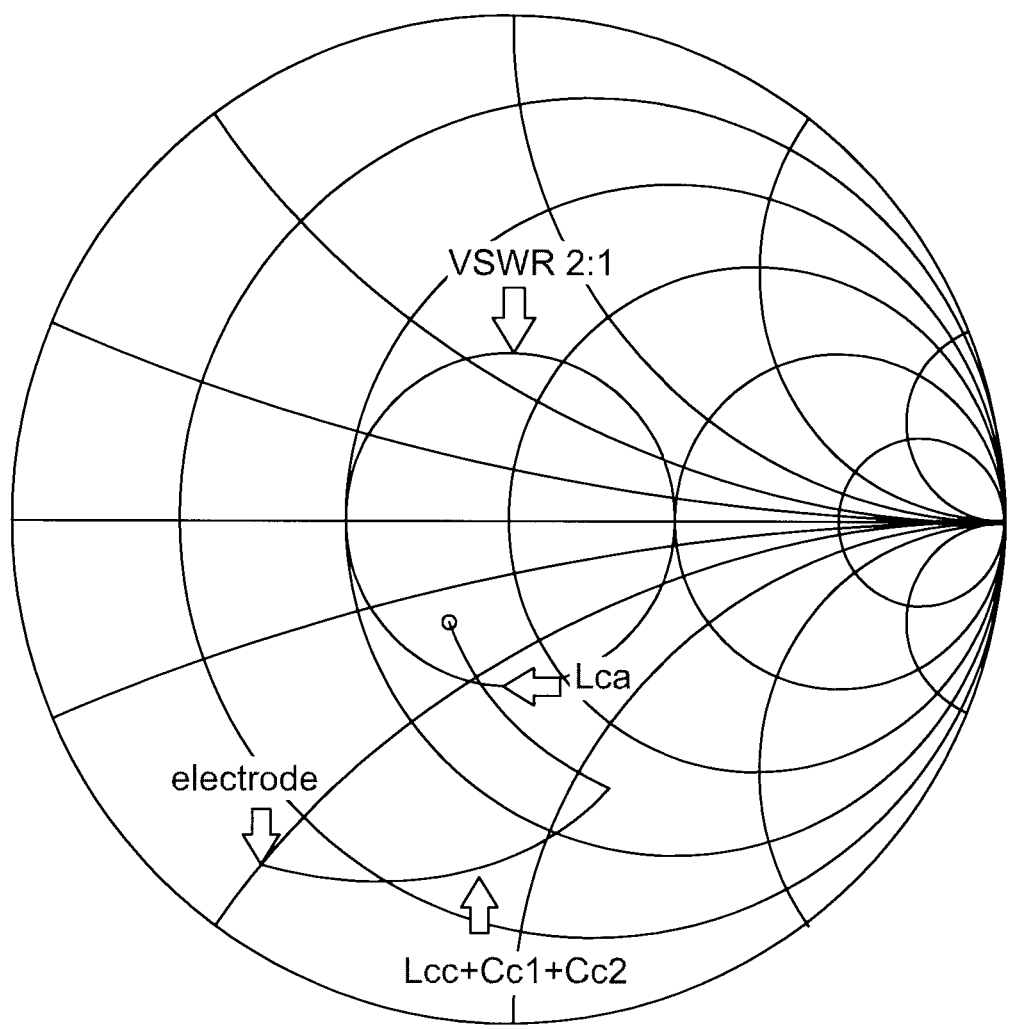
Figure 6:
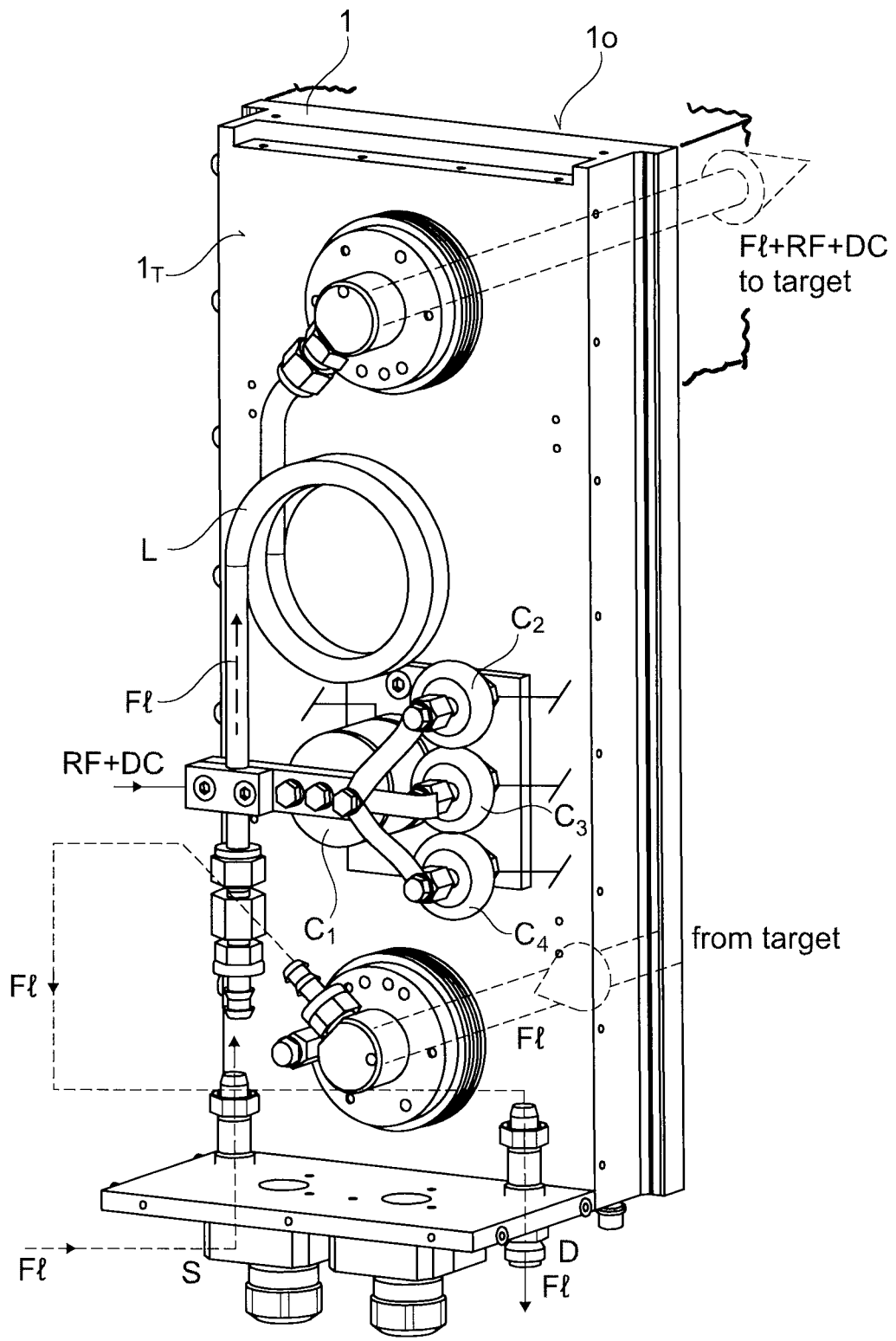
Figure 7:
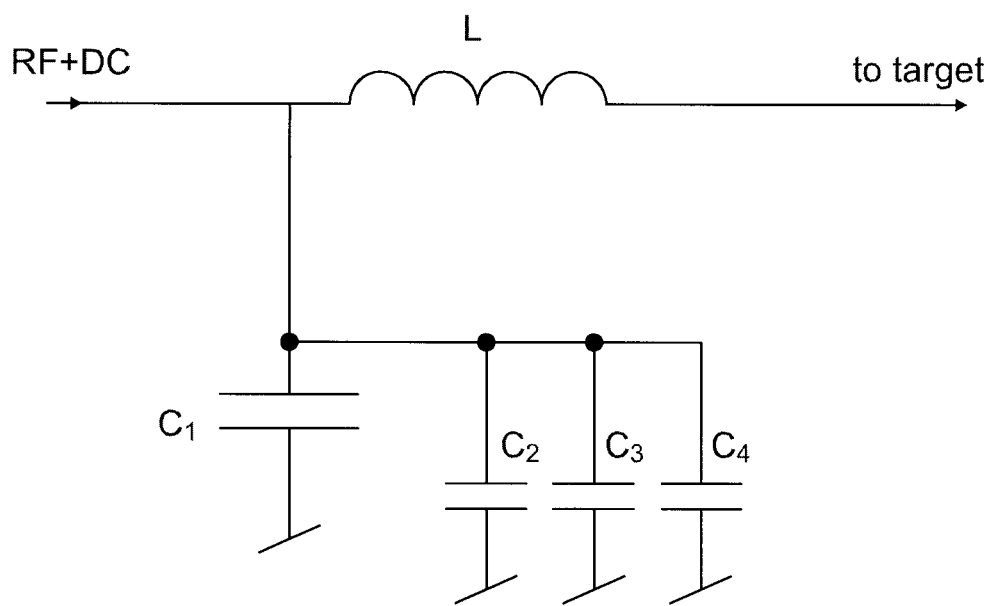
Figure 8:
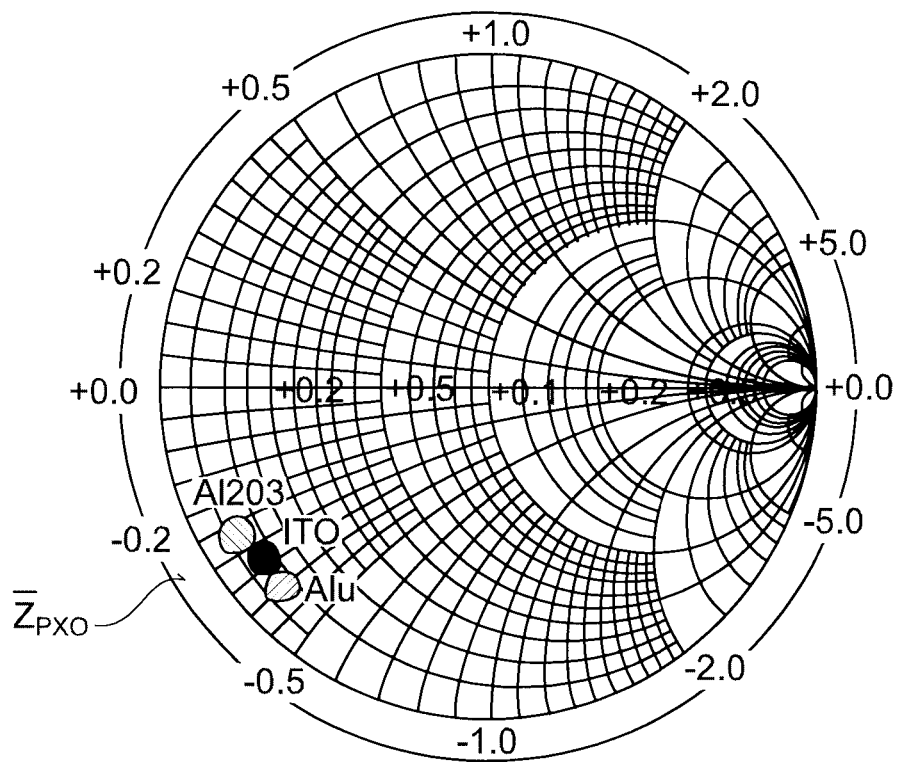
Figure 9:
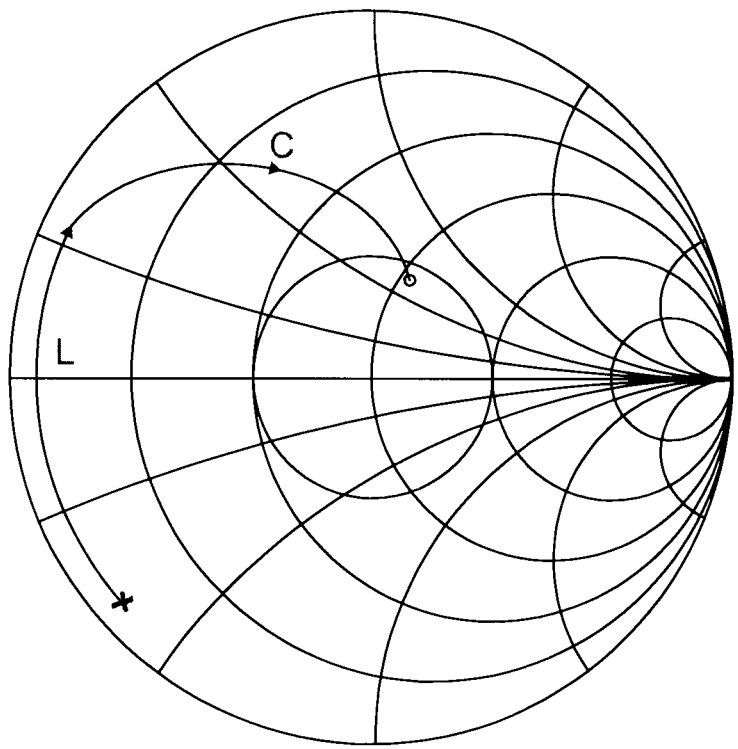
Figure 10:
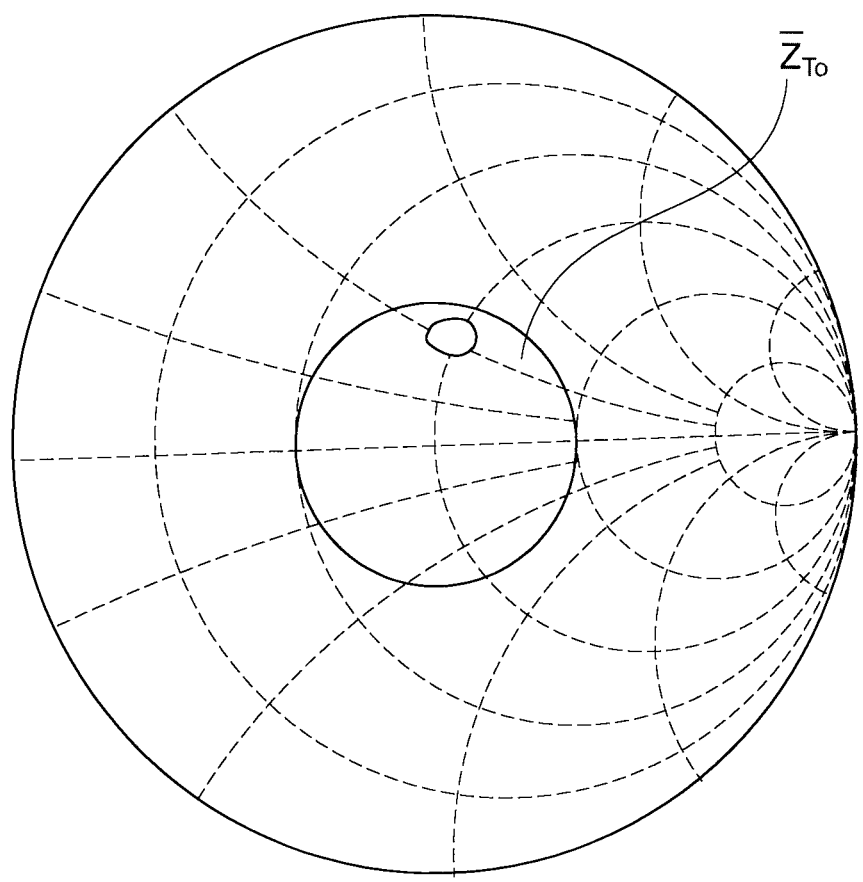
Figure 11:
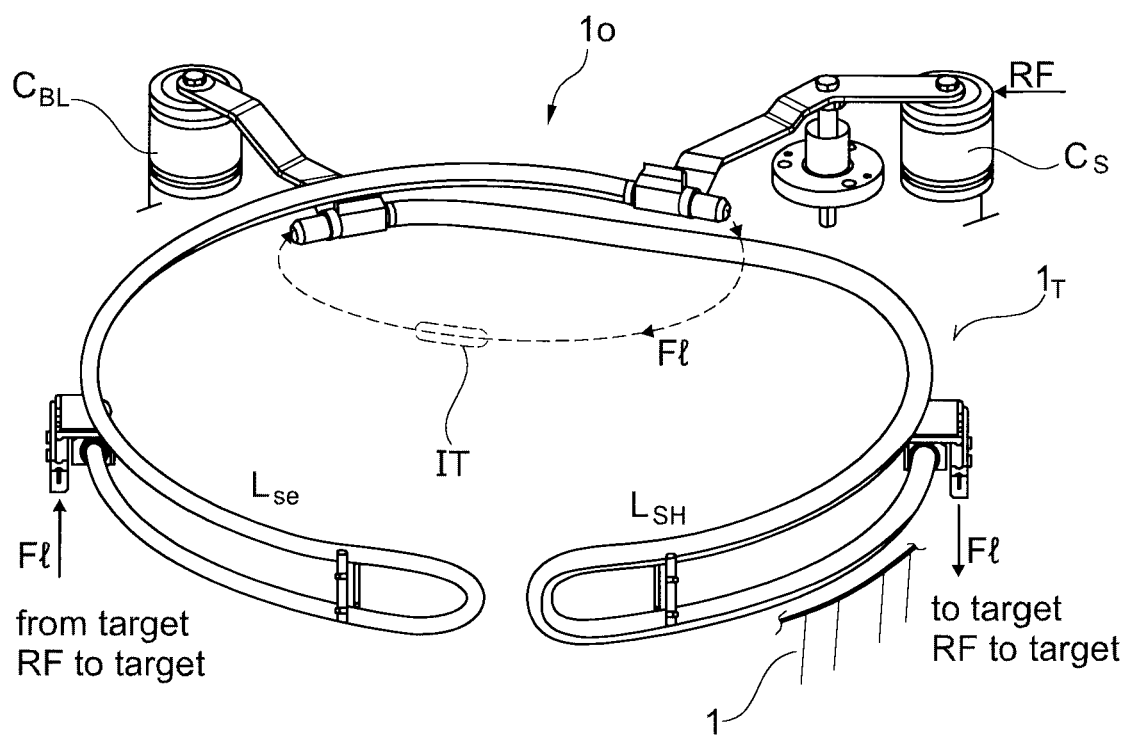
Figure 12:
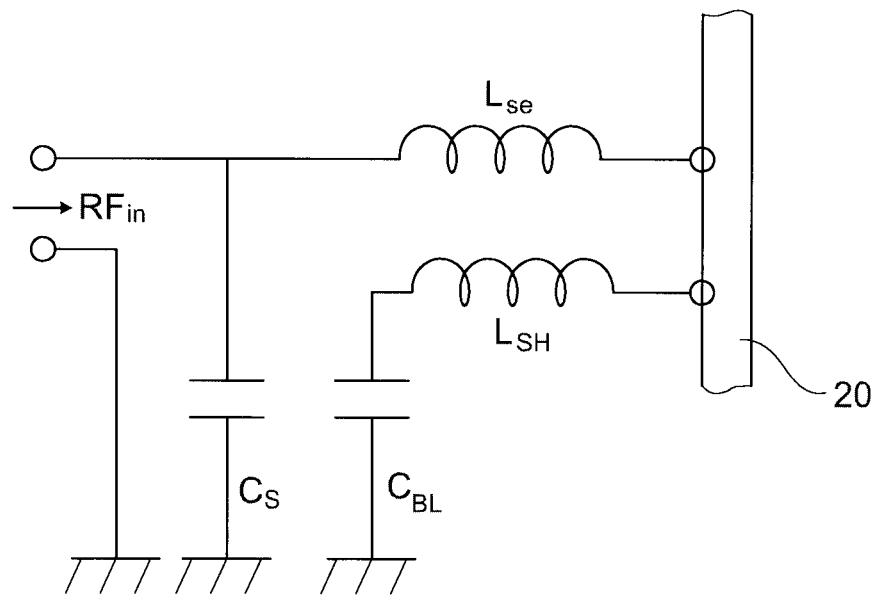
Figure 13:
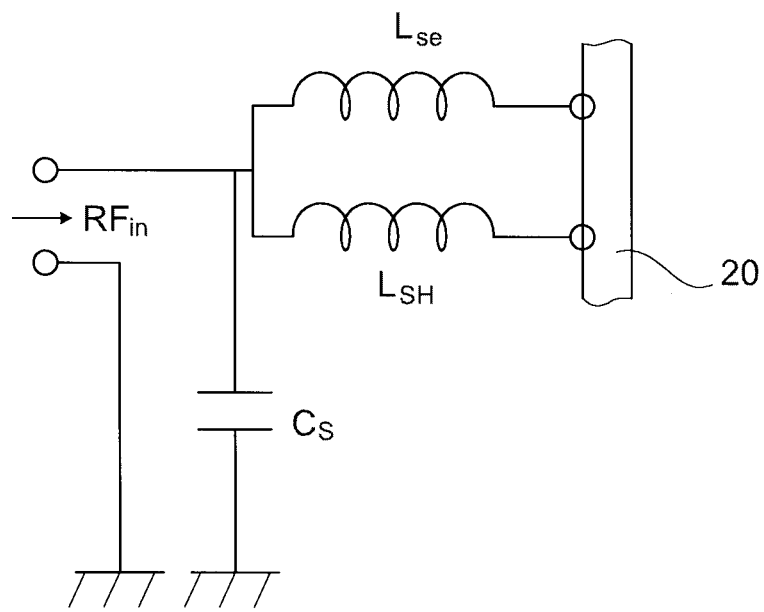

The figures show:

FIG. 1: by means of a simplified signal-flow/functional-block diagram a prior art matching structure;

FIG. 2: in a representation in analogy to that of FIG. 1 the matching structure according to the present invention;

FIG. 3: simplified an electric current compensation and impedance transform network as exploited in embodiment and variants according to the present invention;

FIG. 4: a more detailed example of an electric current compensation and time invariant impedance transform network as of embodiments or variants of the present invention;

FIG. 5: in a Smith chart representation of the impedance transformation realized by a network according to FIG. 4;

FIG. 6: in a simplified, perspective representation an embodiment of the time invariant impedance transform network on a vacuum plasma processing module according to the invention;

FIG. 7: The electric current compensation and time invariant impedance transform network as of the module of FIG. 6 and according to an embodiment or variant of the present invention;

FIG. 8: The initial input impedances of different sputtering modules for different target sputtering in Smith chart representation;

FIG. 9: The general transform, according to embodiments or variants of the invention, of the impedances as of FIG. 8 by the network according to FIG. 7 in Smith chart representation;

FIG. 10: the input impedances to the networks according to FIG. 6 or 7 resulting from the impedance transforms by these networks at the different sputter modules;

FIG. 11: in a simplified, perspective representation an embodiment of a time invariant impedance transform network of a vacuum plasma processing module according to the invention;

FIG. 12: The electric current compensation and time invariant impedance transform network as of the module of FIG. 11 and according to an embodiment or variant of the present invention;

FIG. 13: A further possibility to realize the electric current compensation and time invariant impedance transform network by amendment of the module of FIG. 11 and according to an embodiment or variant of the present invention.

In the following description we use the following abbreviations:
a) VPPM with non-indexed reference number: vacuum plasma processing module e.g. a sputtering module;
b) VPPM with o-indexed reference number: a vacuum plasma processing module according to the present invention and incorporating a module according to a);
c) TITN: a time invariant impedance transform network;
d) CTITN: a time invariant impedance transform network with the additional ability of current compensation.

FIG. 1 shows, by means of a simplified signal-flow/functional-block diagram, prior art RF power delivery to RF operated vacuum plasma process modules 1, 2, . . . , called VPPM. The VPPM 1, 2, . . . are e.g. sputtering modules, etching modules, PECVD modules, cathodic arc evaporation modules, plasma evaporation modules, electron beam evaporation modules, generically VPPM at which the plasma discharge-PL-electrode is RF supplied and/or another electrode e.g. a workpiece carrier electrode is RF biased. Such electrodes are addressed in FIG. 1 by by $3_{1,2}, \ldots$ to which Rf power is applied.

The VPPM, or at least a part of the processing modules 1,2, . . . are different in that, in operation, they present at the Rf power input different or over time differently behaving complex input impedances $Z_{P1}, Z_{P2} \ldots$.

As a basis of the present invention it is recognized, that the input impedances $Z_{Px}$ (x standing for 1,2, . . . ) of the $VPPM_x$ may be written as:

$$Z_{Px}(t)=Z_{Pxo}+\Delta Z_{Px}(t)$$

Thereby the time invariant impedance part $Z_{Pxo}$ may be freely selected e.g. as that impedance value which is momentarily present when initiating the respective vacuum plasma process, or e.g. as an average impedance value of the time varying $Z_{Px}(t)$ over the processing timespan.

The time invariant part $Z_{Pxo}$ may be regarded as an impedance working point and the time varying part $\Delta Z_{Px}(t)$ as momentary deviation of $Z_{Px}(t)$ about the impedance working point. (Please note that the impedances Z are complex entities).

A dedicated match box $5_{1,2}, \ldots$ is narrowly coupled to each $VPPM_{1,2} \ldots$. Each match box $5_{1,2}, \ldots$ transforms the respective input impedance $Z_{Px}(t)$ in an input impedance $Z_{Lx}$ to the match box $5_x$ from which the impedance seen from a RF supply power generator 7 is dependent. Customarily the $Z_{Lx}$ impedances are made as equal as possible and may be addressed by $Z_L$. This necessitates that every match box $5_x$ is constructed to perform automatic fast impedance transform. Inversely formulated, the match boxes $5_x$ match a predetermined impedance $Z_L$ to the respective impedances $Z_{Px}(t)$. A switch 9 distributes, consecutively, the Rf power from the Rf supply power generator 7 to the respective match boxes $5_{1,2}$ ..., i.e. $5_x$.

Thus according to the conventional matching technique of FIG. 1, a dedicated match box $5_x$ is hooked to every $VPPM_x$, matching the output impedance of the RF power generator e.g. of 50Ω to the respective input impedances of the $VPPM_x$. The match boxes do all include fast automatic matching ability so as to take time variations of the respective impedances $Z_{Px}(t)$ into account.

According to the present invention and according to the representation of FIG. 2 at least a part of the time invariant matching is performed by including a time invariant impedance transform network $1_T, 2_T ... X_T$ in the respective VPPM 1,2 ... X. There results VPPM $1_o, 2_o ... X_o$.

The time invariant impedance transform networks, called TITN consist of passive and discrete inductive elements $L_{1T,2T, ... XT}$ and of passive, discrete capacitive elements $C_{1T,2T, ... XT}$, with spurious or discrete resistive elements R (not shown in FIG. 2).

By means of the respective TITN $1_T, 2_T, ... X_T$ the respective input impedances $Z_{Px}(t) = Z_{Pxo} + \Delta Z_{Px}(t)$ are transformed to input impedances of the VPPM $1_o, 2_o ... X_o$ $$Z_{1T,2T ...}(t) = Z_{To} + \Delta Z_{1T,2T ...}(t).$$

The TITN $1_T, 2_T, ...$ are constructed so, that the absolute values of the time invariant parts $Z_{To}$ (complex entities) of all VPPM $1_o, 2_o ...$ are in a predetermined impedance-range or are only neglectably different or are even equal.

Consecutive RF power distribution from RF power supply generator 7 to the VPPM $1_o, 2_o, ...$ is realized c via a single, central matchbox 11 and a switch 9. The switch, which may be incorporated in the match box 11 and is controlled by a timer unit 10.

The match box 11 performs matching of the generator output impedance to the input impedances $Z_{1T,2T ... XT}$ and thus performs all the fast, automatic time variable matching. If necessary the match box 11 additionally performs remaining time invariant matching, if the $Z_{To}$ of the VPPM $1_o, 2_o ...$ are still not tolerably different and/or the $Z_{To}$ does not accord with the output impedance of the Rf power supply generator 7.

There results, that only one expensive matchbox 11 for time varying matching is to be provided and, additionally, that this single matchbox 11 may often be realized much simpler end less expensive than one processing module dedicated matchbox $5_{1,2}$ ..., according to prior art techniques.

From the concept according to the present invention, there result modules $1_o, 2_o ...$ which incorporate a passive TITN of inductive and capacitive discrete elements between the respective RF input and the respective process electrode $3_1, 3_2 ...$ of the VPPM $1_o, 2_o ...$.

The concept according to the invention may be considered of splitting overall matching between a RF power supply generator and multiple, different VPPM, on one hand in decentralized, module-dedicated time invariant impedance transforming and, on the other hand, in a central matching at least performing time varying, module specific matching, possibly additionally some time invariant matching.

The remaining central matchbox 11 may be provided remote from the VPPM $1_o, 2_o ...$, in opposition to prior art matchboxes $5_{1,2}$ ... which are to be mounted directly to the respective VPPM 1,2 ....

The Rf currents to be supplied to the VPPM 1,2, ... may be quite large up to 100 A rms and even more. When providing the central match box 11 remote from the arrangement of the modules VPPM $1_o, 2_o, ...$ such high currents are to be considered along the supply connection of RF power to the VPPM $1_o, 2_o, ...$.

This is taken into account in an embodiment of the invention by so called current compensation technique realized by the TITN $1_T, 2_T ....$ By such technique only a reduced part of the Rf current supplied to the vacuum plasma processing at the VPPM 1, 2, ... flows through the central matchbox 11 and the connection to the VPPM $1_o, 2_o, ....$ The remaining current to be supplied e.g. for a plasma discharge, is added at the respective TITN $1_T, 2_T, .... $ Thus in this embodiment the respective TITN $1_T, 2_T, ...$ act additionally as current compensation networks and are addressed by CTITN $1_T, 2_T ....$ FIG. 3 shows generically a current compensation network as may be exploited in one embodiment of the CTITN $1_T, 2_T, ... X_T$. FIG. 4 shows an example of realizing such current compensation and impedance transform network, as addressed now called CTITN $1_T, 2_T, ....$ FIG. 5 shows the respective smith chart representation.

According to FIG. 3, generically, there is provided at a CTITN $1_T$ and/or $2_T$ and/or $3_T ...$, a current compensation impedance $Z_{cc}$ which shunts the Rf input, via impedance $Z_{ca}$, for the supply current $i_{ca}$. The compensation current $i_{cc}$ is added to the current $i_{ca}$ to result in a current $i_{PL}$. As both impedances $Z_{ca}$ and $Z_{cc}$ are complex, proper tailoring of the compensation impedance $Z_{cc}$ in the CTITN leads to the fact that the real part of $i_{PL}$ becomes larger than the real part of $i_{ca}$. By appropriately designing $Z_{cc}$ of the transform networks CTITN at the respective VPPM $1_o, 2_o, ...$, the time invariant impedance transform networks perform impedance transform as desired as well as current compensation.

The discrete inductive and capacitive elements of CTITN $1_T, 2_T, ...$ may therefore be dimensioned for standing high currents, higher than the current $i_{ca}$ from the Rf supply generator and the elements of the central matchbox 11 as well as the connection lines from the Rf generator 7 to the match box 11 and via switch 9 to the CTITN $1_T$ and/or $2_T$ and/or ... may be tailored for standing lower currents.

The power connection lines from the RF power generator 7 up to at least one or to all of the CTITN $1_T, 2_T, ...$ or at least a part of these RF power connection lines 13a, 13b, 13c (see FIG. 2) may therefore be realized by transmission lines including coaxial cable.

Especially if the discrete elements of the CTITN $1_T, 2_T, ...$ are tailored for the high currents there may occur on one hand the need of cooling such networks. On the other hand often the VPPN 1,2 ... need per see cooling abilities e.g. for the sputtering targets, i.e. cooling abilities by a cooling fluid. Thus, in some variants or embodiments of the invention a cooling fluid provided for cooling the respective VPPN is also flown through parts of the TITN or CTITN for cooling such parts. Possibly no additional cooling ability may be needed at the central match box 11.

Inductors of the TITN or of the CTITN or parts thereof may be realized by hollow tube conductors, and are thus perfectly suited to flow a gaseous or liquid cooling medium therethrough, especially that medium which also flows through parts of the VPPM 1,2, ....

Most flexible interconnection of a remote central matchbox 11, via the switch 9, to the remote VPPM $1_o, 2_o, ...$ is performed by means of coaxial cables, e.g. 50Ω cables as transmission lines. These cables or similar transmission lines may not be conceived for currents as high as RF currents supplying the VPPM 1,2, for the respective vacuum plasma process therein.

By realizing the respective TITN $1_T$, $2_T$ additionally as current compensation networks CTITN $1_T$, $2_T$, . . . , this problem may be resolved.

Realization of such a transform and current compensation network CTITN at a VPPM e.g. $1_o$ shall be shown by an example:

In the example of FIGS. 4 and 5 there is valid:
Rf power from the generator: 5000 W;
Connection from generator to the respective CTITN network e.g. $1_o$ of FIG. 2: 50Ω coaxial cable.
$L_{ca}$ representing coaxial cable: 1200 nH
Inductor $L_{cc}$ in CTITN: 300 nH
Series capacitor $C_{c1}$ in CTITN: 300 pF
Shunt capacitor $C_{c2}$ in CTITN: 200 pF
Dimensioning for maximum current through the coaxial cable and thus trough $L_{ca}$ of 15 $A_{rms}$.
Maximum plasma discharge current $i_{PL}$: 30 $A_{rms}$ As the coaxial cable does not stand more than 15 $A_{rms}$ and this value is to be fully exploited when operating the respective processing module, e.g. $1_o$ of FIG. 2, also called reactor, the cable should be loaded by 25Ω minimum. Therefor the impedance $Z_{P1}$ (see FIG. 2), the reactor load or input impedance, is transformed by the addressed time invariant impedance transform network CTITN $1_T$ into the 2:1 VSWR-circle (Voltage Standing Wave Ratio). As may be seen from the smith chart representation of FIG. 5, the cable becomes loaded with a negative real impedance of less than 25Ω. Thus, the current through the current compensation and transform network CTITN $1_T$ of the VPPM $1_o$ will add to the current through the cable, resulting in a current to the process in processing module VPPN 1 of e.g. 30 $A_{rms}$. As shown in FIG. 4 tapping off the shunt capacitor $C_{c2}$ along the inductance $L_{cc}$ may be manually shifted in the CTITN so as to perform fine tuning.

FIG. 6 shows a CTITN $1_T$ of a VPPM $1_o$, namely of a square sputtering module. The inductivity L is realized as a pipe to flow the liquid cooling fluid Fl which is also fed to the target mount of VPPM $1_o$ for cooling same. The flow path of the cooling fluid Fl from source S to drain D is schematically shown in FIG. 6 in dash line. The electric network of the CTITN $1_T$ is represented in FIG. 7. Transformation tuning may e.g. be realized by simply exchanging the inductivity pipe for L.

FIG. 8 shows the impedances $Z_{Pxo}$ of sputter modules 1,2,3 according to FIG. 6 for Al2O3, ITO and Al targets. FIG. 9 shows the transformation performed in principle by the LC transform network $1_T$ of FIG. 7 and FIG. 10 shows the resulting practically identical $Z_{To}$.

FIG. 11 shows, in analogy to the representation of FIG. 6 a realization example of CTITN $1_T$ at a circular sputtering module VPPM $1_o$. FIG. 12 shows the electrical network of the CTITN $1_T$ as realized at VPPM $1_o$ of FIG. 11. The fluid Fl output from inductivity pipe $L_{SE}$ is linked to the fluid input to the inductivity pipe $L_{SH}$ by an electrically isolating tube schematically shown at IT in dash dotted line. The path of cooling fluid Fl is again shown in dashed line. As evident from FIG. 12 the target 20 may be Rf supplied at more than one locus, and the Rf current distribution to these loci may be adjusted by respectively selecting the values of $L_{Se}$ and $L_{SH}$.

An equal Rf current to the supply loci at the target 20 may be achieved by electrically connecting the Fl-out end of the inductivity pipe $L_{Se}$ with the Fl-in end of the inductivity pipe $L_{SH}$ as represented in FIG. 13.

Different aspects of the invention are summarized as follows:

Aspects:

1) A method of RF power delivering from a RF supply generator to at least one vacuum plasma processing module, comprising time varying matching the output impedance of said RF supply generator to the input impedance of said vacuum plasma processing module by
   a) Providing in said vacuum plasma processing module an impedance transform network and performing by said impedance transform network a time invariant impedance transform of said input impedance of said vacuum plasma processing module to an input impedance to said impedance transform network;
   b) Performing time variable matching of said output impedance of said RF supply generator to said input impedance of said impedance transform network by a matchbox operationally connected to said impedance transform network.
2) The method of aspect 1 further comprising performing by said impedance transform network a current compensation, so as to deliver to a vacuum plasma process performed in said vacuum plasma processing module a current which is larger than a supply current supplied to said impedance transform network from said RF supply generator.
3) The method of at least one of aspects 1 or 2 comprising interconnecting the output of said RF supply generator and said impedance transform network comprising interconnecting by a transmission line.
4) The method of aspect 3 said interconnecting comprising interconnecting by said transmission line comprising interconnecting by a coaxial cable.
5) The method of at least one of aspects 1 to 3 constructing said impedance transform network comprising providing inductive and capacitive elements which are all discrete and passive elements.
6) The method of at least one of aspects 1 to 5 comprising cooling at least some parts of said impedance transform network.
7) The method of at least one of aspects 1 to 6 comprising providing at least a part of at least one inductive element of said impedance transform network by a hollow conductor and flowing a cooling medium through said hollow conductor.
8) The method of aspect 7 comprising flowing said cooling medium through a cooling arrangement of a part of said vacuum plasma processing module not being a part of said impedance transform network.
9) The method of at least one of aspects 1 to 8 comprising RF power delivering from said RF supply generator to at least two of said vacuum plasma processing modules via a single central matchbox.
10) The method of at least one of aspects 1 to 9 comprising RF power delivering from said RF supply generator, consecutively, to at least two of said vacuum plasma processing modules and performing at least time variable matching of said output impedance of said RF supply generator to the respective input impedance of the at least two impedance transform networks of said at least two vacuum plasma processing modules, by a single, central matchbox.
11) The method of at least one of aspects 9 or 10 comprising performing by at least one of said at least two impedance transform networks a current compensation, so as to deliver to a vacuum plasma process performed in the respective vacuum plasma processing module a current which is larger than a supply current supplied to said at least one impedance transform network from said RF supply generator.

12) The method of aspect 11 comprising performing a respective one of said current compensation at both of said at least two impedance transform networks.

13) The method of at least one of aspects 9 to 12 comprising interconnecting the output of said RF supply generator and at least one of said at least two impedance transform networks comprising interconnecting by a transmission line.

14) The method of aspect 13 said interconnecting by a transmission line comprising interconnecting by a coaxial cable.

15) The method of at least one of aspects 13 or 14 comprising interconnecting the output of said RF supply generator and each of said at least two impedance transform networks comprising interconnecting by a respective transmission line.

16) The method of at least one of aspects 9 to 15 constructing said at least two impedance transform networks comprising providing inductive and capacitive elements which are all discrete and passive elements.

17) The method of at least one of aspects 6 to 16 comprising performing by each of said respective at least two impedance transform networks a respective time invariant impedance transform of the respective input impedance of the respective vacuum plasma processing module to a respective desired input impedance to said respective impedance transform network, time invariant components of the absolute values of said desired input impedances being in a desired range or being neglectably different or being equal.

18) The method of at least one of aspects 9 to 17 wherein said at least two vacuum plasma processing modules are different.

19) The method of at least one of aspects 1 to 18 comprising RF supplying by said impedance transform network of said at least one vacuum plasma processing module at least one of a plasma discharge current to said at least one vacuum plasma processing module and of providing RF biasing or RF workpiece biasing to said at least one vacuum plasma processing module.

20) The method of at least one of aspects 1 to 19 said at least one vacuum plasma processing module being one of a sputtering module, an etching module, a PECVD layer deposition module, a cathodic arc evaporation module, a plasma evaporation module, an electron-beam evaporation module.

21) The method of at least one of aspects 1 to 20 comprising performing by said impedance transform network a current compensation by means of a shunt impedance.

22) The method of at least one of aspects 1 to 21 comprising connecting an electrode for plasma processing to more than one output of said impedance transform network.

23) The method of aspect 22 comprising selecting the distribution of RF currents at said more than one outputs.

24) The method of at least one of aspects 1 to 23 for manufacturing a vacuum plasma treated workpiece.

25) The method of at least one of the aspects 1 to 24 performed by an apparatus or a plant according the at least one of the following aspects.

26) A RF vacuum plasma processing module comprising a time invariant impedance transform network between an RF supply input and at least one of a plasma discharge electrode and of a RF biased electrode for said vacuum plasma processing.

27) The RF vacuum plasma processing module of aspect 26 wherein said time invariant impedance transform network comprises inductive and capacitive elements, all being discrete elements.

28) The RF vacuum plasma processing module of at least one of aspects 26 or 27 wherein said time invariant impedance transform network is constructed to supply a RF current to said electrode which is larger than a RF supply current input to said time invariant impedance transform network.

29) The RF vacuum plasma processing module of at least one of aspects 26 or 28 said time invariant impedance transform network comprises a cooling arrangement.

30) The RF vacuum plasma processing module of at least one of aspects 26 to 29 said time invariant impedance transform network comprising at least one inductive element at least a part thereof being realized as a hollow conductor.

31) The RF vacuum plasma processing module of aspect 30, said hollow conductor being flow-connectable or flow-connected to at least one of a flow source and of a flow-drain for a cooling fluid.

32) The RF vacuum plasma processing module of at least one of aspects 29 to 31 said cooling arrangement comprising a hollow body, flow connected to a source and/or a drain for a cooling fluid, said hollow body being in cooling fluid communication with a part of said vacuum plasma processing module which is not part of said time invariant impedance transform network.

33) The RF vacuum plasma processing module of at least one of aspects 26 to 32 said time invariant impedance transform network being manually tunable.

34) The RF vacuum plasma processing module of at least one of aspects 26 to 33 said time invariant impedance transform network having more than one RF current output.

35) The RF vacuum plasma processing module of aspect 34, said more than one RF current outputs being connected to said electrode.

36) The RF vacuum plasma processing module of at least one of aspects 26 to 35 being one of a sputter module, an etching module, a PECVD nodule, a cathodic arc evaporation module, a plasma evaporation module, an electron-beam evaporation module.

37) A plasma treatment plant, comprising at least two of the RF vacuum plasma processing modules, each respectively according to at least one of aspects 26 to 36, at least one RF supply generator operatively connected to a match box, the RF output of said matchbox being operatively connected to the RF inputs of both time invariant impedance transform networks of said at least two vacuum plasma processing modules.

38) The plasma treatment plant of aspect 37 said matchbox being constructed to perform automatic, time variant matching to the input impedances of both of said time invariant impedance transform networks.

39) The plasma treatment plant of at least one of aspects 37 or 38 further comprising a switch unit and a timing control unit operatively connected to a control input of said switch unit, said switch unit being constructed to switch RF power supply consecutively to said at least two time invariant impedance transform networks.
40) The plasma treatment plant of at least one of aspects 37 to 39 said at least two vacuum plasma processing modules being different modules.
41) The plasma treatment plant of at least one of aspects 37 to 40 the Rf power supply connection from said RF power generator to said at least two time invariant impedance transform networks comprising at least one transmission line.
42) The plasma treatment plant of aspect 41, said transmission line comprising at least one coaxial cable.
43) The plasma treatment plant of at least one of aspects 37 to 42 wherein each of the time invariant impedance transform networks of said at least two vacuum plasma processing modules is constructed to provide its input impedance to comprise a time invariant impedance part, the absolute value of the time invariant impedance parts of said at least two time invariant impedance networks being in a desired range or being only neglectably different or being equal.
44) The plasma treatment plant of at least one of aspects 37 to 43 said match box being remote from said at least two vacuum plasma processing modules.
45) A method of manufacturing a substrate treated by a RF supplied vacuum plasma treatment by means of a method according to at least one of aspects 1 to 25 and/or a module according to at least one of aspects 26 to 36 and/or a plant according to at least one of aspects 37 to 44.

What is claimed is:

1. A method of RF power delivering from a RF supply generator to at least one vacuum plasma processing module, comprising time varying matching the output impedance of said RF supply generator to the input impedance of said vacuum plasma processing module by
   a) Providing in said vacuum plasma processing module an impedance transform network and performing by said impedance transform network a time invariant impedance transform of said input impedance of said vacuum plasma processing module to an input impedance to said impedance transform network;
   b) Performing time variable matching of said output impedance of said RF supply generator to said input impedance of said impedance transform network by a matchbox operationally connected to said impedance transform network;
   c) providing at least a part of at least one inductive element of said impedance transform network by a hollow conductor and flowing a cooling medium through said hollow conductor and through a cooling arrangement of a part of said vacuum plasma processing module not being a part of said impedance transform network.

2. The method of claim 1 further comprising performing by said impedance transform network a current compensation, so as to deliver to a vacuum plasma process performed in said vacuum plasma processing module a current which is larger than a supply current supplied to said impedance transform network from said RF supply generator.

3. The method of claim 1 constructing said impedance transform network comprising providing inductive and capacitive elements which are all discrete and passive elements.

4. The method of claim 1 comprising RF power delivering from said RF supply generator to at least one further vacuum plasma processing module having said impedance transform network as well, via a common central matchbox.

5. The method of claim 4 comprising performing by each of said respective at least two impedance transform networks a respective time invariant impedance transform of the respective input impedance of the respective vacuum plasma processing module to a respective desired input impedance to said respective impedance transform network, time invariant components of the absolute values of said desired input impedances being in a desired range or being neglectably different or being equal.

6. The method of claim 4 wherein said at least two vacuum plasma processing modules are different.

7. The method of claim 1 comprising RF power delivering from said RF supply generator, consecutively, to said one vacuum plasma processing module and to a further vacuum plasma processing module comprising said impedance transform network as well and performing at least time variable matching of said output impedance of said RF supply generator to the respective input impedance of the at least two impedance transform networks of said at least two vacuum plasma processing modules, by a single, central matchbox.

8. The method of claim 1 said at least one vacuum plasma processing module being one of a sputtering module, an etching module, a PECVD layer deposition module, a cathodic arc evaporation module, a plasma evaporation module, an electron-beam evaporation module.

9. The method of claim 1 comprising connecting an electrode for plasma processing to more than one output of said impedance transform network.

10. The method of claim 9 comprising selecting the distribution of RF currents at said more than one outputs.

11. The method of claim 1 for manufacturing a vacuum plasma treated workpiece.

12. The method of claim 1 performed by a RF vacuum plasma processing module comprising a time invariant impedance transform network between an RF supply input and at least one of a plasma discharge electrode and of a RF biased electrode for said vacuum plasma processing, said time invariant impedance transform network comprising at least one inductive element at least a part thereof being realized as a hollow conductor, said hollow conductor being flow-connectable or flow-connected to at least one of a flow source and of a flow-drain for a cooling fluid, said hollow conductor being in cooling fluid flow communication with a cooling arrangement for a part of said vacuum plasma processing module which is not part of said time invariant impedance transform network.

13. A method of manufacturing a substrate treated by a RF supplied vacuum plasma treatment by means of a method according to claim 1.

14. A RF vacuum plasma processing module comprising a time invariant impedance transform network between an RF supply input and at least one of a plasma discharge electrode and of a RF biased electrode for said vacuum plasma processing, said time invariant impedance transform network comprising at least one inductive element at least a part thereof being realized as a hollow conductor, said hollow conductor being flow-connectable or flow-connected to at least one of a flow source and of a flow-drain for a cooling fluid, said hollow conductor being in cooling fluid flow communication with a cooling arrangement for a part of said vacuum plasma processing module which is not part of said time invariant impedance transform network.

15. The RF vacuum plasma processing module of claim 14 wherein said time invariant impedance transform network is constructed to supply a RF current to said electrode which the RF current is larger than a RF supply current input to said time invariant impedance transform network.

16. The RF vacuum plasma processing module of claim 14 said time invariant impedance transform network being manually tunable.

17. The RF vacuum plasma processing module of claim 14 said time invariant impedance transform network having more than one RF current output.

18. The RF vacuum plasma processing module of claim 17, said more than one RF current outputs being connected to said electrode.

19. The RF vacuum plasma processing module of claim 14 being one of a sputter module, an etching module, a PECVD nodule, a cathodic arc evaporation module, a plasma evaporation module, an electron-beam evaporation module.

20. A plasma treatment plant, comprising at least two RF vacuum plasma processing modules, at least one according to claim 14, the other one comprising said time invariant impedance transform network as well, at least one RF supply generator operatively connected to a match box, the RF output of said matchbox being operatively connected to the RF inputs of both time invariant impedance transform networks of said at least two vacuum plasma processing modules.

21. The plasma treatment plant of claim 20 said matchbox being constructed to perform automatic, time variant matching to the input impedances of both of said time invariant impedance transform networks.

22. The plasma treatment plant of claim 20 further comprising a switch unit and a timing control unit operationally connected to a control input of said switch unit, said switch unit being constructed to switch RF power supply consecutively to said at least two time invariant impedance transform networks.

23. The plasma treatment plant of claim 20 said at least two vacuum plasma processing modules being different modules.

24. The plasma treatment plant of claim 20 wherein each of the time invariant impedance transform networks of said at least two vacuum plasma processing modules is constructed to provide its input impedance to comprise a time invariant impedance part, the absolute value of the time invariant impedance parts of said at least two time invariant impedance networks being in a desired range or being only neglectably different or being equal.

25. The plasma treatment plant of claim 20 said match box being remote from said at least two vacuum plasma processing modules.

* * * * *